United States Patent [19]

Lee et al.

[11] Patent Number: 5,453,398
[45] Date of Patent: Sep. 26, 1995

[54] METHOD FOR FABRICATING QUANTUM WIRE LASER DIODE

[75] Inventors: Hae-Gwon Lee; Jae-Jin Lee; Bo-Woo Kim, all of Daejeon, Rep. of Korea

[73] Assignee: Electronics and Telecommunications Research Institute, Rep. of Korea

[21] Appl. No.: 335,453

[22] Filed: Nov. 7, 1994

[30] Foreign Application Priority Data

Dec. 14, 1993 [KR] Rep. of Korea .................. 93-27632

[51] Int. Cl.$^6$ .................................................. H01L 21/20
[52] U.S. Cl. ........................... 437/89; 437/90; 437/129
[58] Field of Search ........................... 437/89, 90, 129, 437/110; 148/DIG. 95

[56] References Cited

U.S. PATENT DOCUMENTS

| | | | |
|---|---|---|---|
| 4,099,305 | 7/1978 | Cho et al. | 437/90 |
| 4,614,564 | 9/1986 | Sheldon et al. | 437/90 |
| 5,188,977 | 2/1993 | Stengl et al. | 437/89 |
| 5,275,968 | 1/1994 | Takahashi et al. | 437/129 |

OTHER PUBLICATIONS

Greus, et al: "InGaAs/GaAs Quantum Wires Defined By Lateral Top Barrier Modulation": pub. Sep. 7, 1992, pp. 1199–1201; Appl. Pys. Lett. 61(10), American Inst. of Physics.

Hu, et al: "Large Negative Differential Resistance In A Quasi–One–Dimensional Quantum Wire"; Sep. 7, 1994, pp. 1208–1210; Appln. Phys. Lett. vol. 61, No. 10; American Inst. of Physics.

Mahalingam, et al: "Arsenic Precipitates In $Al_{0.3}Ga_{0.7}As/$GaAs Multiple Superlattice And Quantum Well Structures"; Jun. 29, 1992, pp. 3253–3255; Appl. Phys. Lett. 60(26); American Inst. of Physics.

Grambow, et al: "Quantum Wires Prepared By Liquid–Phase–Epitaxial Over–Growth . . . ": pub. Jun. 15, 1992, pp. 2998–3000; Appl. Pys. Lett. 60(24), American Inst. of Physics.

Fasol: "Absence of low temperature saturation of electron–electron scattering in a single . . . ": Aug. 17, 1994, pp. 831–833; Appln. Phys. Lett. vol. 61, No. 7; American Inst. of Physics.

*Primary Examiner*—R. Bruce Breneman
*Assistant Examiner*—Linda J. Fleck
*Attorney, Agent, or Firm*—Larson and Taylor

[57] ABSTRACT

Disclosed is a fabricating method of a quantum wire laser diode, comprising the steps of preparing a GaAs substrate; sequentially forming n-type epitaxial layers and a first photoresist layer on the GaAs substrate; removing a portion of the intrinsic GaAs layer by using a first etching solution, and then removing the photoresist layer; wet-etching away a portion of the intrinsic AlAs layer in the vicinity of the opening by using a second etching solution; growing a quantum structure in the molecular beam epitaxy apparatus to form a multiple quantum well on the intrinsic GaAs layer and form a quantum wire on the n-type energy band slope layer through the opening; removing the quantum well, the intrinsic GaAs layer and the intrinsic AlAs layer simultaneously by using a third etching solution; sequentially forming a p-type energy band slope layer, a p-type cladding layer and a p$^+$-GaAs layer, on the n-type energy band slope layer and the quantum wire, and forming a second photoresist layer having a predetermined pattern on the p$^+$-GaAs layer; removing the layers laminated on the n-type resistive contact layer using the second photoresist layer patterned thus as an etching mask and then removing the second photoresist layer; and forming an n-type ohmic contact metal on the n-type resistive contact layer and a p-type ohmic contact metal on the p$^+$-GaAs layer. By this method, because a quantum well formed near to a quantum wire therein is simultaneously removed during removal of other epitaxial layers, another etching process is not required for removing only the quantum well.

2 Claims, 7 Drawing Sheets

5,453,398

1

METHOD FOR FABRICATING QUANTUM WIRE LASER DIODE

BACKGROUND OF THE INVENTION

1. Field of the Invention

The present invention relates to a method for fabricating a quantum wire laser diode, and more particularly to a fabricating method of a quantum wire laser diode utilizing molecular beam diffraction of a well-known molecular beam epitaxy process (hereinafter, referred to as "MBE").

2. Description of the Prior Art

Generally, quantum wires can be fabricated by forming a V-shaped groove on a substrate and then growing a multiple quantum well on the groove formed thus. It is fabricated depending upon the difference of the growth rate between the inner side and the bottom of the V-shaped groove. Another difficult etching process has to be carried out to removed partially multiple quantum wells formed in the vicinity of the quantum wires in order to complete the fabrication process. In the above-described method of forming the quantum well structure on a semiconductor substrate, there arises the problem that additional etching-process has to be performed.

SUMMARY OF THE INVENTION

It is the object of the present invention to provide a method of fabricating a quantum wire laser diode utilizing the molecular beam diffraction of the MBE recrystallization growth so as to solve the above-described problem.

To achieve the above-mentioned object, the method for fabricating a quantum wire laser diode utilizing a molecular beam diffraction of a molecular beam epitaxy recrystallization growth according to the aspect of the present invention comprises the steps of: preparing a GaAs substrate; sequentially forming an n-type resistive contact layer, a cladding layer, an n-type energy band slope layer, an intrinsic AlAs layer, an intrinsic GaAs layer, on the GaAs substrate; forming a first photoresist layer having a predetermined pattern on the intrinsic GaAs layer to form an opening therein; removing a portion of the intrinsic GaAs layer by using a first etching solution to form a fine slit in the intrinsic GaAs layer, and then removing the photoresist layer; wet-etching away a portion of the intrinsic AlAs layer in the vicinity of the opening by using a second etching solution to expose a surface of the n-type energy band slope layer; growing a quantum structure in the molecular beam epitaxy apparatus to form a multiple quantum well on the intrinsic GaAs layer and form a quantum wire on the n-type energy band slope layer through the opening; removing the quantum well, the intrinsic GaAs layer and the intrinsic AlAs layer simultaneously by using a third etching solution; sequentially forming a p-type energy band slope layer, a p-type cladding layer and a p$^+$-GaAs layer, on the n-type energy band slope layer and the quantum wire, and forming a second photoresist layer having a predetermined pattern on the p$^+$-GaAs layer; removing the layers laminated on the n-type resistive contact layer using the second photoresist layer patterned thus as an etching mask and then removing the second photoresist layer; and forming an n-type ohmic contact metal on the n-type resistive contact layer and a p-type ohmic contact metal on the p$^+$-GaAs layer.

In this method, the quantum wire has a bulging portion in center thereof.

By this method, because a quantum well formed in the

2 vicinity of a quantum wire therein is simultaneously removed during removal of other epitaxial layers, another etching process is not required for removing only the quantum well.

BRIEF DESCRIPTION OF THE DRAWINGS

The above and other advantages of the present invention will become more apparent from the following detailed description with reference to the accompanying drawings, in which.

DETAILED DESCRIPTION OF THE INVENTION

Hereinafter, the present invention will be described in detail with reference to the accompanying drawings.

The present invention utilizes the physical phenomenon of diffraction that occurs when a particle passes through a very thin slit or a gap. The present invention fabricates quantum wire laser diode by exploiting molecular beam diffraction that occurs when molecules pass through a thin slit in the shadow mask during a molecular beam epitaxy process as well-known in this art.

Figure 1A:
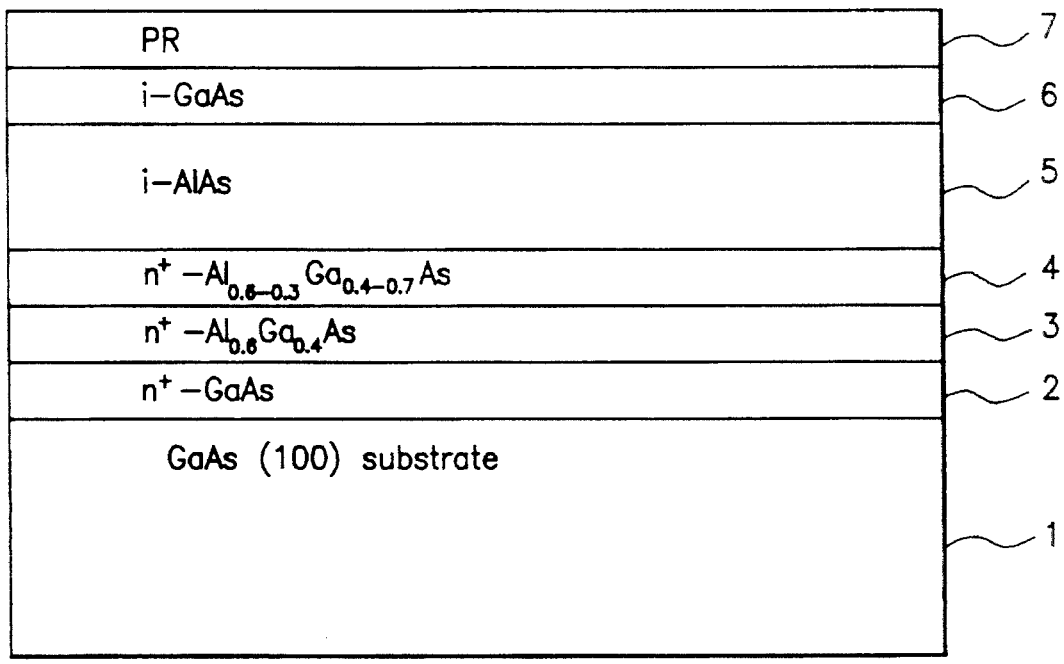
FIGS. 1A to 1L are cross-sectional views showing the processes according to the fabricating method of the present invention.

Referring to FIG. 1A, on a main surface of a GaAs substrate 1, an n$^+$-GaAs layer 2 is grown as a resistive contact layer. On the resistive contact layer 2, an n$^+$-Al$_{0.6}$Ga$_{0.4}$As layer 3 of an n-type cladding layer which contains a very large amount of a silicon impurity, and an n$^+$-Al$_{0.6-0.3}$Ga$_{0.4-0.7}$As layer 4 of an n-type energy band slope layer which is formed between the cladding layer 3 and a luminescent layer of the quantum wire laser diode, are sequentially formed. Thus, n-type layers in the p-i-n junction of the quantum wire laser diode are manufactured.

On the n$^+$-Al$_{0.6-0.3}$Ga$_{0.4-0.7}$As layer 4, an intrinsic AlAs layer 5 which is used to control the distance between a diffraction mask and a quantum wire and an intrinsic GaAs layer 6 which is used for a shadow diffraction mask, are sequentially grown. The intrinsic AlAs layer 9 also is used for selective etching of AlAs so as to form the diffraction mask as a shadow diffraction mask. The intrinsic AlAs layer 5 and the intrinsic GaAs layer 6 do not need to be implanted with impurities because they will be removed after formation of the quantum wire. Also, a first photoresist layer 7 is formed on the intrinsic GaAs layer 6 so as to make the intrinsic GaAs layer 6 into a diffraction layer.

Figure 1B:
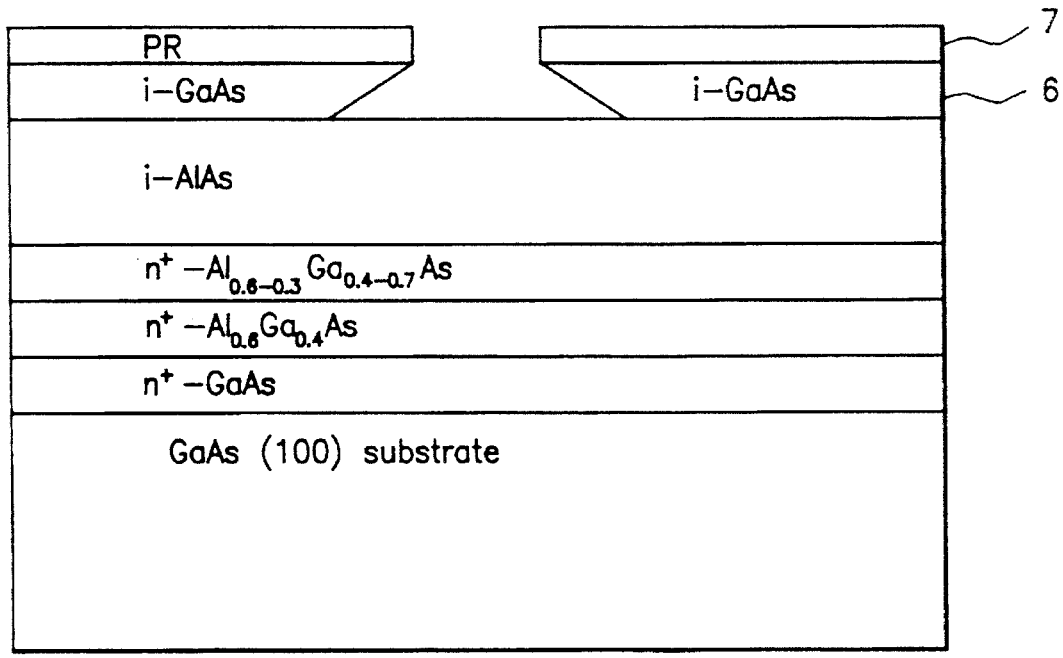
Figure 1C:
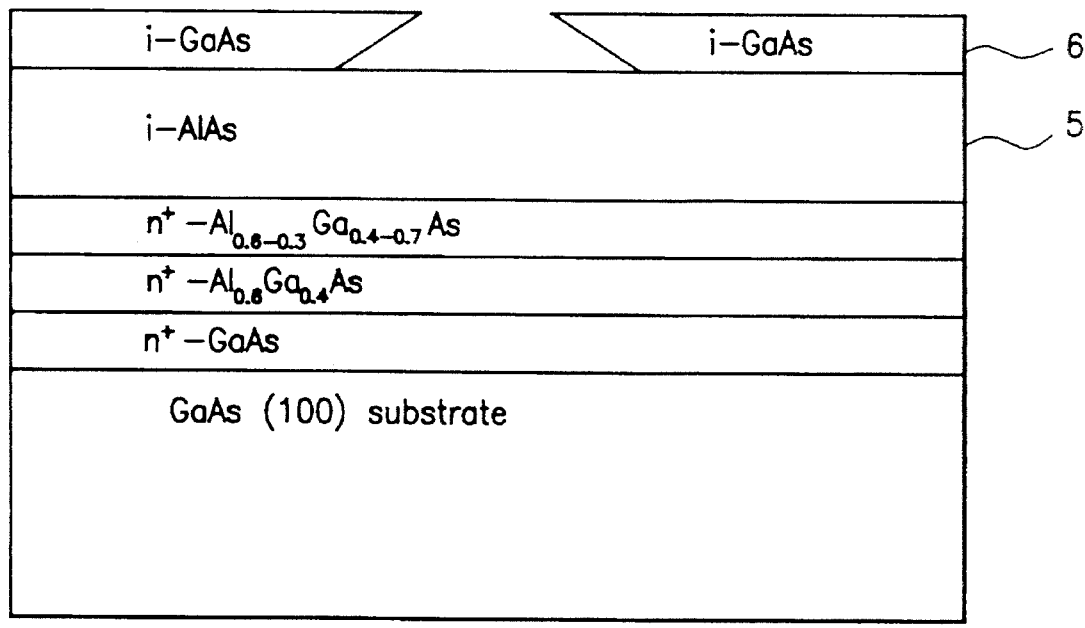

In FIG. 1B, by using a very narrow electron beam, a portion of the first photoresist layer 7 is removed, and then the structure is dipped in GaAs etching solution of Hcl to make a fine gap in the intrinsic GaAs layer 6. Subsequently, the remaining photoresist layer 7 is removed as shown in FIG. 1C.

Figure 1D:
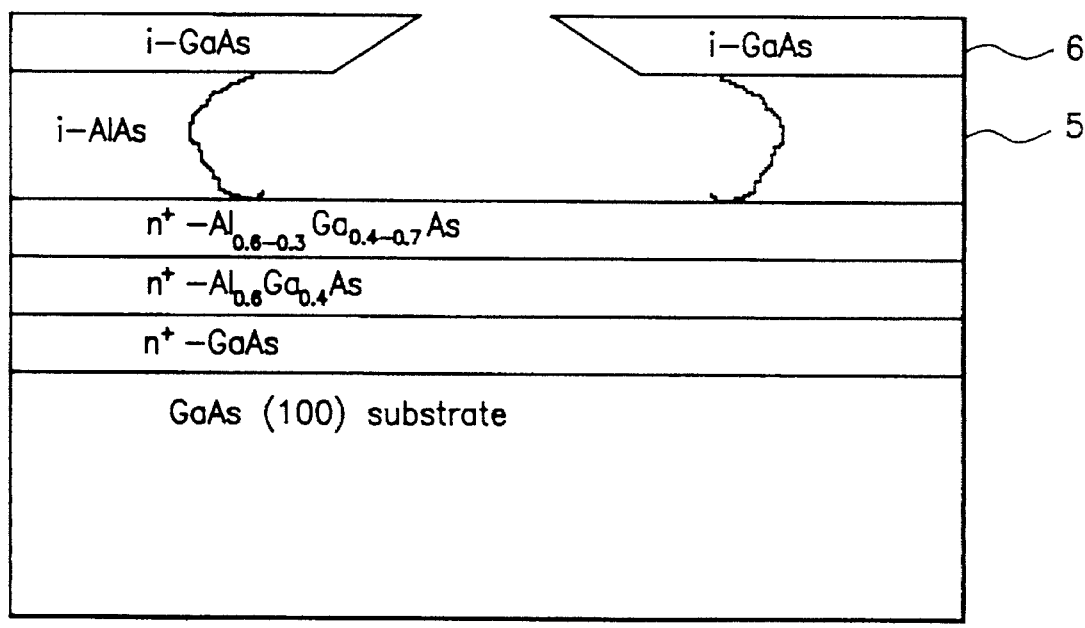

In addition, as shown in FIG. 1D, the intrinsic GaAs layer 6 is partially removed by dipping the structure into an AlAs etching solution of Hcl. As a result, a shadow diffraction mask is formed in the intrinsic AlAs layer 9 below the intrinsic GaAs layer 6.

Figure 1E:
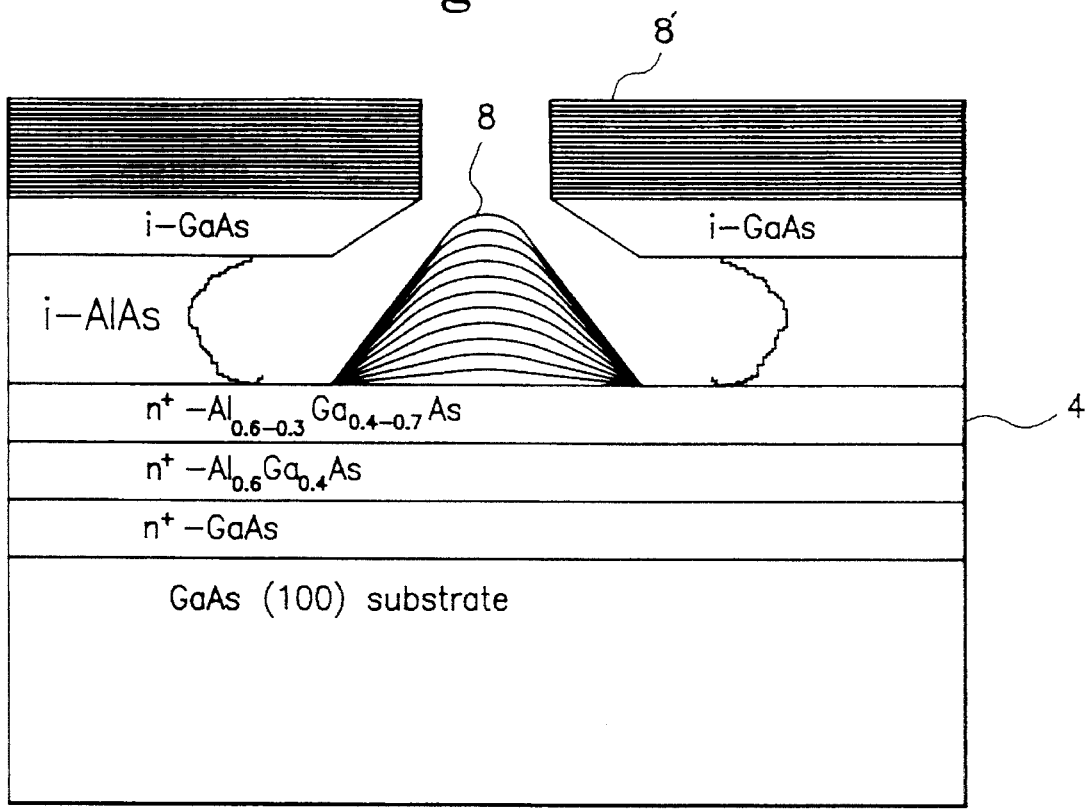

With reference to FIG. 1E, by placing the structure of FIG. 1D in an MBE apparatus, a quantum well 8' is formed on the intrinsic GaAs layer 6, and at the same time a bulging quantum wire 8 is formed on the n-type energy band slope layer 4 because the molecules that passed through a fine slit is diffracted.

Figure 1F:
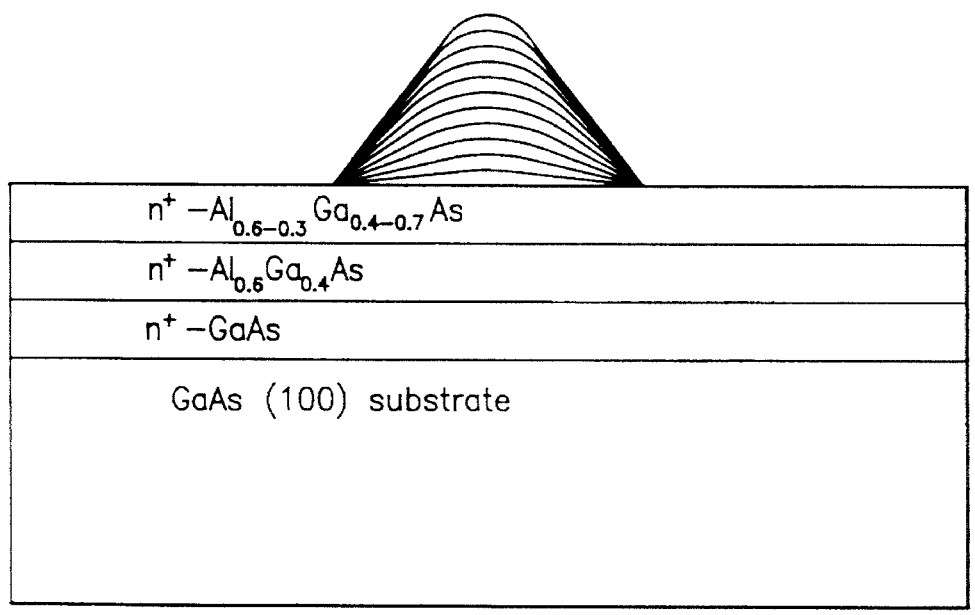

Next, by dipping the structure of FIG. 1E in an AlAs etching solution of Hcl, the quantum well 8', the intrinsic GaAs layer 6 and the intrinsic AlAs layer 5 are all removed, but only the quantum wire 8 is remained on the energy band slope layer 4, as shown in FIG. 1F.

Figure 1G:
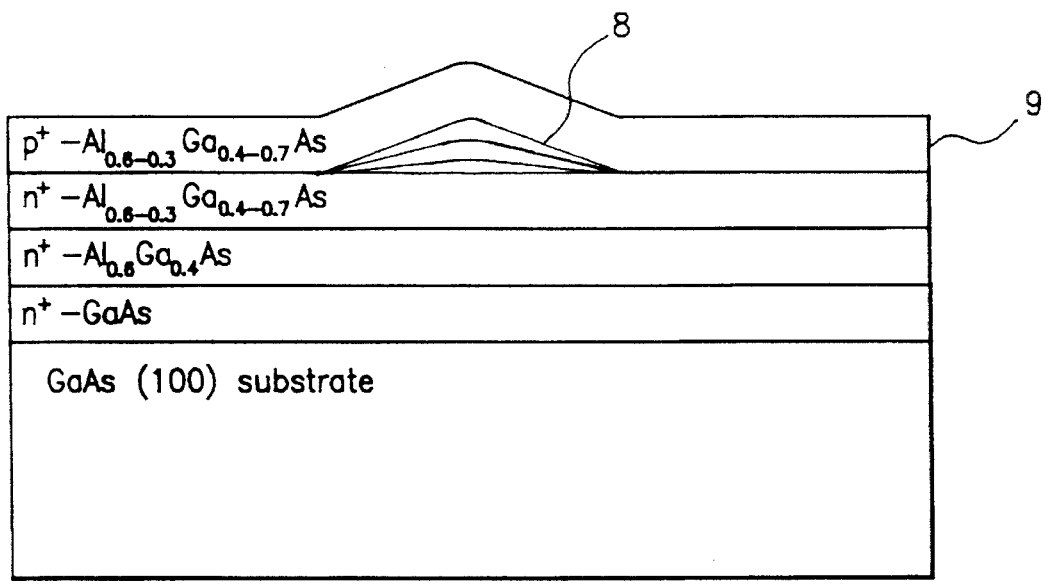
Figure 1H:
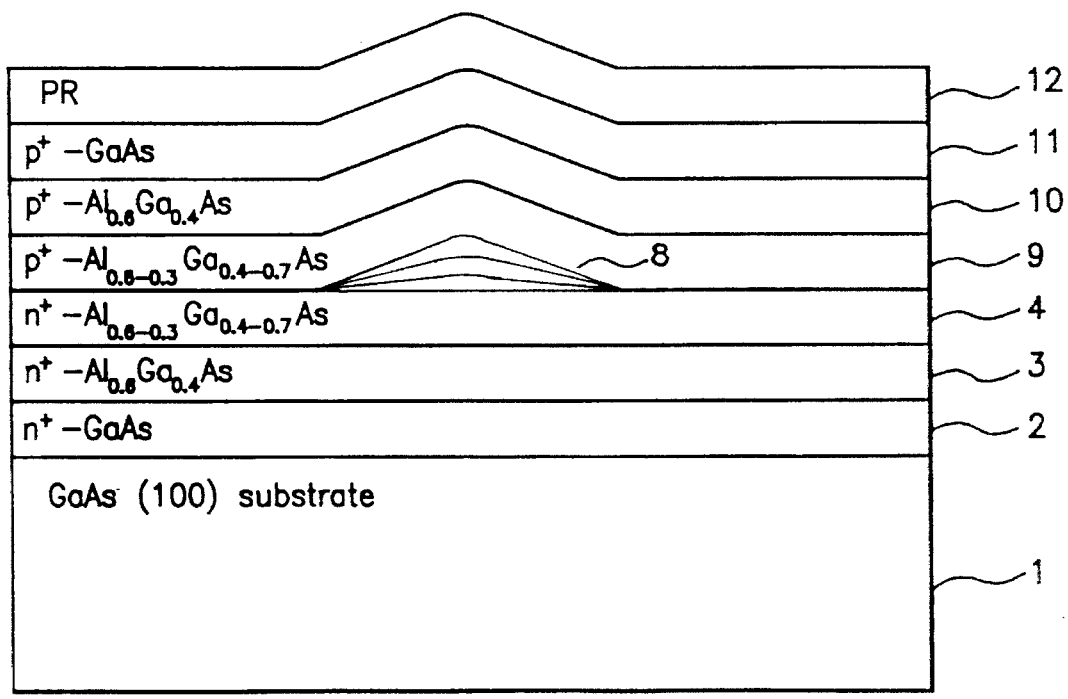
Figure 1I:
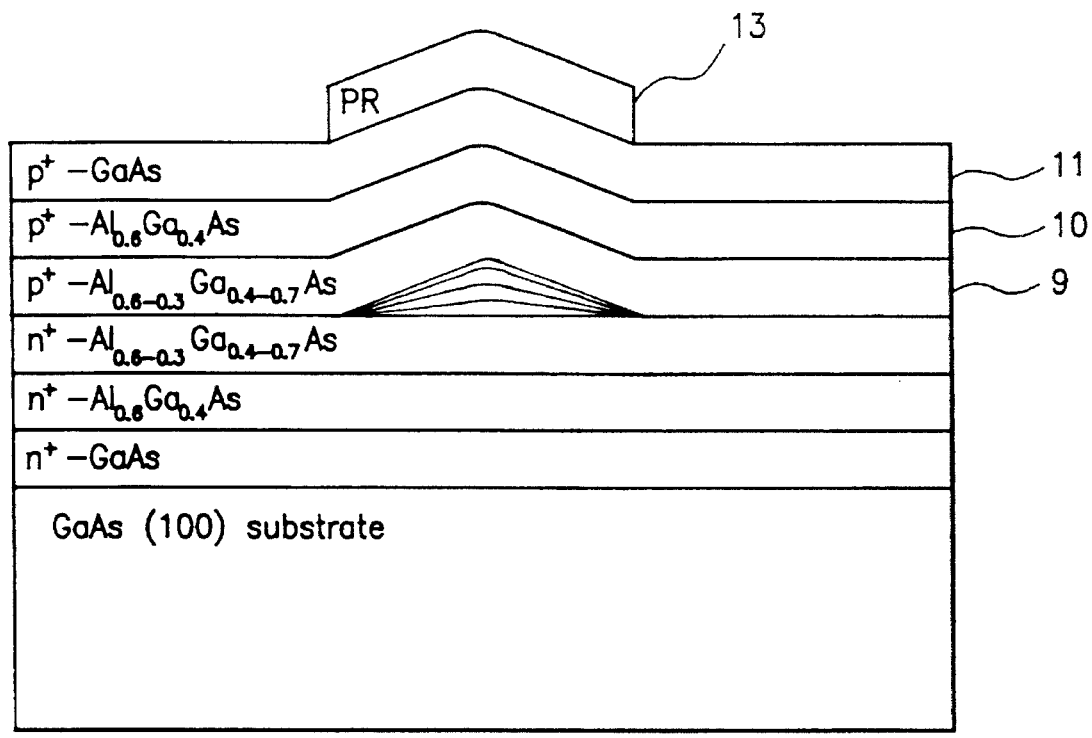

Consequently, a $p^+$-$Al_{0.6-0.3}Ga_{0.4-0.7}As$ layer 9 for using as a p-type energy band slope layer is grown on exposed surface of the energy band slope layer 4 including the quantum wire 8, as shown in FIG. 1G. Then, a $p^+$-$Al_{0.6}Ga_{0.4}As$ layer 10 as a p-type cladding layer of the quantum wire laser diode is grown on the p-type energy band slope layer 9. The $p^+$-GaAs layer 11 for using as a p-type resistive contact layer of the quantum wire laser diode is grown on the p-type cladding layer 10 and then a second photoresist layer 12 is formed on the p-type resistive contact layer 11 as shown in FIG. 1H. The second photoresist layer 12 then is patterned and thus the structure of FIG. 1I is formed.

Figure 1J:
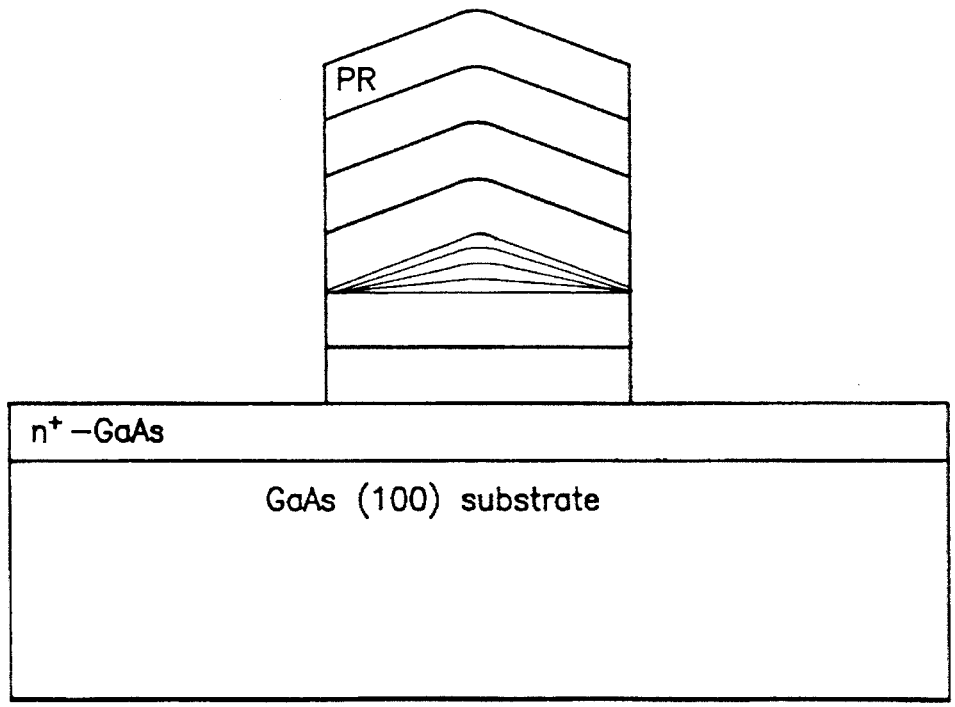
Figure 1K:
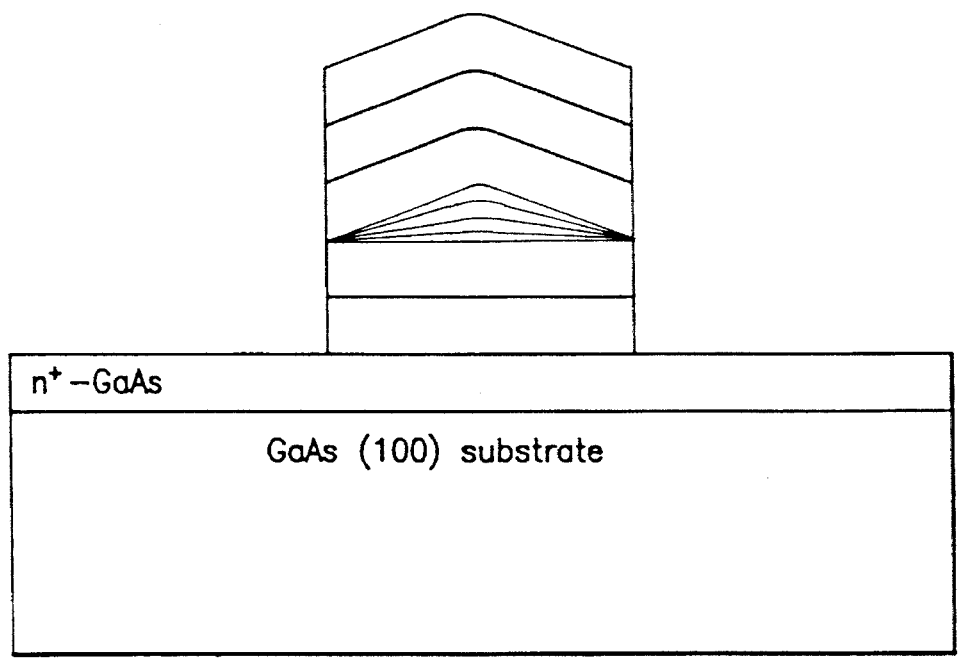

Subsequently, by using the patterned photoresist layer 13 as an etching mask in FIG. 1I, an etching process is performed. Then, every layers formed on the $n^+$-GaAs layer 2 is removed except for the portion underneath the patterned photoresist layer 13, as shown in FIG. 1J. The patterned photoresist layer 13 also is removed so as to form an element, as shown in FIG. 1K.

Figure 1L:
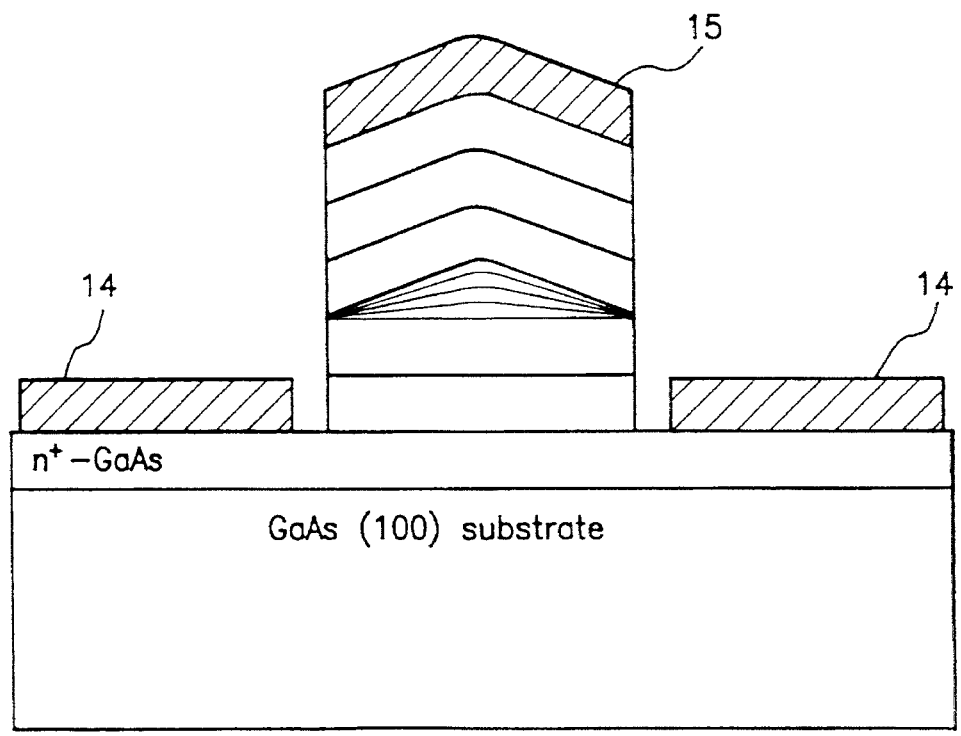
Figure 2:
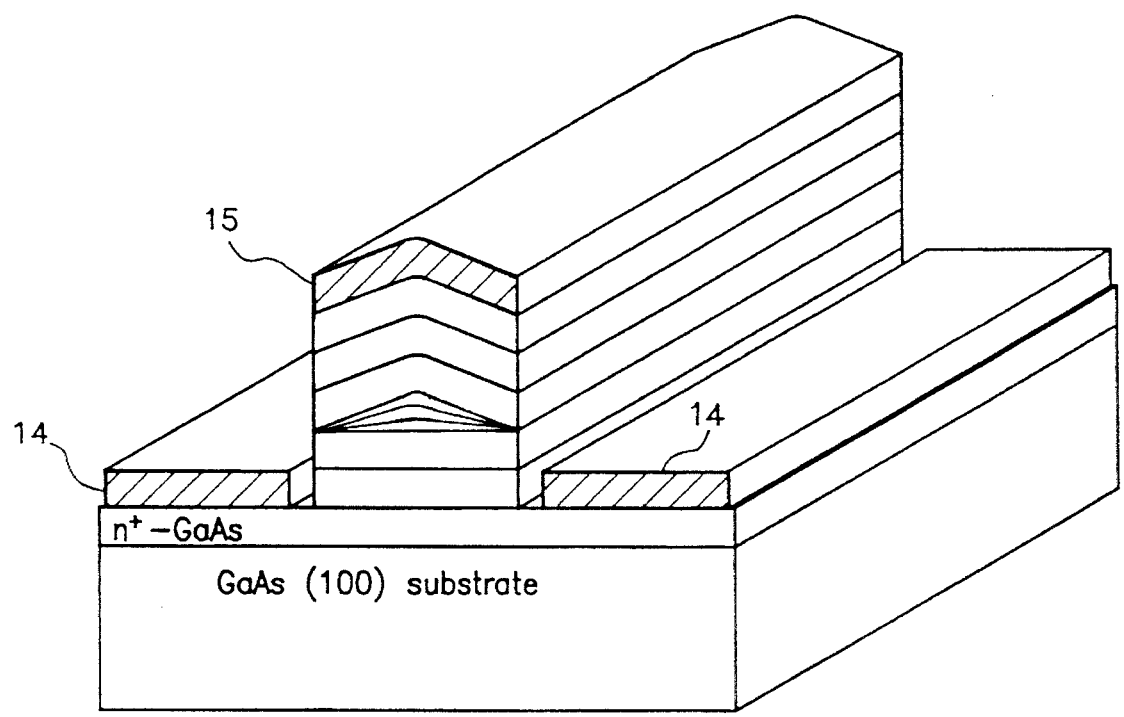
FIG. 2 is a cross-sectional view showing the quantum wire laser diode which is fabricated in accordance with the method of the present invention.

With reference to FIG. 1L, in order to connect lead lines to the element formed thus, an n-type ohmic contact metal 14 is formed on the $n^+$-GaAs layer 2 and a p-type ohmic contact metal 15 is formed on the $p^+$-GaAs layer 11. Therefore, the quantum wire laser diode is completely fabricated as shown in FIG. 2.

As described by the method of fabricating the quantum wire laser diode in accordance with the present invention, because a quantum well formed in the vicinity of a quantum wire therein is simultaneously removed during removal of other epitaxial layers, another etching process is not required for removing only the quantum well.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a quantum wire laser diode utilizing a molecular beam diffraction of a molecular beam epitaxy recrystallization growth, said method comprising the steps of:

preparing a GaAs substrate;

sequentially forming an n-type resistive contact layer, a cladding layer, an n-type energy band slope layer, an intrinsic AlAs layer, an intrinsic GaAs layer, on the GaAs substrate;

forming a first photoresist layer having a predetermined pattern on the intrinsic GaAs layer to form an opening therein;

removing a portion of the intrinsic GaAs layer by using a first etching solution to form a fine slit in the intrinsic GaAs layer, and then removing the photoresist layer;

wet-etching away a portion of the intrinsic AlAs layer in the vicinity of the opening by using a second etching solution to expose a surface of the n-type energy band slope layer;

growing a quantum structure in the molecular beam epitaxy apparatus to form a multiple quantum well on the intrinsic GaAs layer and form a quantum wire on the n-type energy band slope layer through the opening;

removing the quantum well, the intrinsic GaAs layer and the intrinsic AlAs layer simultaneously by using a third etching solution;

sequentially forming a p-type energy band slope layer, a p-type cladding layer and a $p^+$-GaAs layer, on the n-type energy band slope layer and the quantum wire, and forming a second photoresist layer having a predetermined pattern on the $p^+$-GaAs layer;

removing the layers laminated on the n-type resistive contact layer using the second photoresist layer patterned thus as an etching mask and then removing the second photoresist layer; and forming an n-type ohmic contact metal on the n-type resistive contact layer and a p-type ohmic contact metal on the $p^+$-GaAs layer.

2. The method according to claim 1, wherein the quantum wire has a bulging portion in center thereof.

* * * * *